United States Patent
Link et al.

(10) Patent No.: US 8,534,449 B2
(45) Date of Patent: Sep. 17, 2013

(54) RETAINING DEVICE FOR THIN, PLANAR SUBSTRATES

(75) Inventors: Bernd Link, Dornhan (DE); Tobias Dettling, Oberndorf (DE)

(73) Assignee: Gebr. Schmid GmbH (DE)

( * ) Notice: Subject to any disclaimer, the term of this patent is extended or adjusted under 35 U.S.C. 154(b) by 0 days.

(21) Appl. No.: 13/444,984

(22) Filed: Apr. 12, 2012

(65) Prior Publication Data

US 2012/0241294 A1  Sep. 27, 2012

Related U.S. Application Data

(63) Continuation of application No. PCT/EP2010/064318, filed on Sep. 28, 2010.

(30) Foreign Application Priority Data

Oct. 12, 2009  (DE) .......................... 10 2009 049 905

(51) Int. Cl.
*B65G 49/02* (2006.01)
*B65G 49/05* (2006.01)

(52) U.S. Cl.
USPC ................. 198/377.07; 195/465.3; 195/465.4

(58) Field of Classification Search
USPC .................. 198/377.01, 377.03, 377.07, 406, 198/463.3, 465.3, 465.4, 471.1, 474.1, 802, 198/867.02, 803.2; 118/423; 205/137
See application file for complete search history.

(56) References Cited

U.S. PATENT DOCUMENTS

| | | | |
|---|---|---|---|
| 4,646,915 A * | 3/1987 | Ohtaki et al. .............. 198/346.2 |
| 4,954,069 A * | 9/1990 | Friedwald ..................... 425/453 |
| 5,012,917 A | 5/1991 | Gilbert et al. |
| 5,511,651 A * | 4/1996 | Barth ............................. 198/817 |
| 5,555,969 A * | 9/1996 | Yerly ......................... 198/803.3 |
| 6,228,231 B1 | 5/2001 | Uzoh |
| 7,238,392 B2 * | 7/2007 | Kyotani ..................... 427/430.1 |
| 7,458,455 B2 * | 12/2008 | Nakamura et al. ......... 198/463.3 |
| 7,648,018 B2 * | 1/2010 | Inui ............................. 198/463.3 |
| 2003/0056723 A1 * | 3/2003 | Ehrenleitner et al. ........ 118/400 |
| 2005/0183662 A1 | 8/2005 | Ehrenleitner |
| 2007/0212941 A1 | 9/2007 | Hisashi et al. |
| 2008/0149489 A1 | 6/2008 | Varadarajan et al. |
| 2009/0000111 A1 | 1/2009 | Schneider |
| 2010/0126829 A1 * | 5/2010 | Nicolet ....................... 198/465.3 |

FOREIGN PATENT DOCUMENTS

| | | |
|---|---|---|
| DD | 145624 A1 | 12/1980 |
| DE | 3822291 A1 | 1/1990 |
| DE | 4428789 A1 | 5/1995 |
| DE | 10200910 A1 | 7/2003 |
| DE | 102004058557 A1 | 6/2006 |
| DE | 102007038116 * | 2/2009 |
| EP | 1249405 A1 | 10/2002 |

OTHER PUBLICATIONS

Written Opinion issued in connection with PCT/EP2010/064318.
International Search Report issued in connection with PCT/EP2010/064318.

* cited by examiner

*Primary Examiner* — Mark A Deuble
(74) *Attorney, Agent, or Firm* — Akerman Senterfitt

(57) ABSTRACT

A retaining device for printed circuit boards is of a frame-like form, with transporting carriages arranged on the outer longitudinal sides and intended for transporting the retaining device, a retaining frame of the retaining device for the substrates being arranged between the transporting carriages. The retaining frame is mounted height-adjustably on the transporting carriages and so a substrate restrained in it can be lowered or raised during the treatment.

13 Claims, 2 Drawing Sheets

RETAINING DEVICE FOR THIN, PLANAR SUBSTRATES

CROSS-REFERENCE TO RELATED APPLICATIONS

This application is a continuation of PCT Application No. PCT/EP2010/064318, filed Sep. 28, 2010, and claims priority to DE 10 2009 049 905.9 filed Oct. 12, 2009, the disclosures of which are hereby incorporated by reference in their entirety.

FIELD OF APPLICATION AND PRIOR ART

The invention relates to a retaining device for thin sheet-like or planar substrates, for example thin printed circuit boards or so-called conductor foils or solar cells, the substrates being advantageously transported with the retaining device through treatment installations or continuously operating installations.

It is known for example from US 2010-0126829 A1 to fasten substrates such as thin printed circuit boards by their front edge or their rear edge to an elongated clip. These elongated clips are then fixed or hung with their ends on transporting chains running to the left and right alongside a continuously operating installation and are transported by them. It may be provided in this case that a clip holds both a rear edge of a leading substrate and a front edge of a trailing substrate, so that a continuous chain of substrates is formed by means of the clips. However, the clamping together of the substrates in the form of a chain on the one hand and the rigid formation of the retaining clips on the other hand are problematic here.

Problem and Solution

The invention addresses the problem of providing a retaining device mentioned at the beginning with which problems of the prior art can be avoided and, in particular, of creating an advantageous possible way in which substrates mentioned at the beginning can be held and transported and can be transported through treatment installations such as continuously operating installations or the like.

This problem is solved by a retaining device with the features of claim 1. Advantageous and preferred embodiments of the invention are the subject of the further claims and are explained in more detail below. The wording of the claims is made the content of the description by express reference.

It is provided that the retaining device for the substrates is altogether of a frame-like form. Arranged on two outer longitudinal sides are transporting carriages, by means of which the retaining device is transported, in particular along a route through treatment installations such as continuously operating installations or the like. If the substrates are, for example, thin printed circuit boards or else substrates for solar cells, a step such as cleaning, etching or coating, in particular electrochemical coating, may take place in these treatment installations. A retaining frame of the retaining device for the substrates is provided between the transporting carriages, or they are secured or fastened to the retaining frame directly. According to the invention, the retaining frame is mounted height-adjustably on the transporting carriages. Such height adjustability makes it possible for the transporting carriages to be moved as it were on a plane or level, for example on rails or circulating transporting chains described above. The possibility of adjusting or lowering the retaining frame in its height can achieve the result that, when the substrates are being transported outside a treatment installation, they are as it were in a higher or the highest position. If the retaining device with the substrates has been moved into a treatment installation, for example with an immersion tank for the substrates, the retaining frame together with the substrates can be lowered, until they make contact, at least with their underside, with a treatment medium in the immersion tank and are wetted by it. In particular, complete lowering and immersion are also possible. This makes it possible to avoid having to lower or bring down the entire retaining device together with the transporting carriages, in particular a transporting device such as rails or transporting chains, which generally involves considerable effort.

The height adjustability may advantageously be variable, either in specific steps or else, particularly advantageously, steplessly. The extent of achievable height adjustment may lie in the range of several cm, for example 5 cm to 15 cm, or at approximately 10% to 30% of the width of the retaining device. Excessive height adjustability is accompanied by greatly increasing expenditure for the mechanical equipment.

The height-adjustable mounting of the retaining frame on the transporting carriages may be formed on the one hand in such a way that a relative movement can take place between the two, exclusively in a direction vertical to the plane of the retaining frame or to the transporting direction or transporting plane. This allows a possibly excessive or harmful overloading of the substrates in the retaining frame to be avoided. Such a precisely predetermined movement can be easily achieved by appropriately forming links for connecting the retaining frame and the transporting carriages, which is discussed in further detail below.

On the other hand, and advantageously, it is possible that, when there is a relative movement of the retaining frame in relation to the transporting carriage, for example from the maximally lowered position into the maximally raised position or the transporting position, the substrate lying parallel to the transporting plane in both stated positions, it is inclined during the movement between these positions, for example with the rear region tilted down more. An angle may be shallow, at most 20° to 30°. This possibly allows easier detachment of the substrate from the surface of a treatment fluid in an immersion tank. Furthermore, for example in the case of a completely immersed substrate, the flowing off of treatment fluids can be achieved more easily over a tilted-down region, which particularly reduces the loading caused by treatment fluids on it or their weight. Such a temporary inclination is easily possible by appropriately forming linking connections between the retaining frame and the transporting carriages, which together form the retaining device, and is also known to a person skilled in the art. Restricted guidance from outside may also be imposed for the position of the retaining frame together with the substrate.

In one embodiment of the invention, the transporting carriages may be formed in such a way that they have rollers for mobile transport, in particular on rails, in the manner of a rolling transport. On a path running through, there may therefore be a left-hand rail and a right-hand rail, on each of which a transporting carriage travels, that is to say a left-hand transporting carriage and a right-hand transporting carriage. They may be connected to each other, for example in the manner of a frame, or alternatively also be independent or not joined together, that is to say two separate parts.

In an alternative embodiment of the invention, the transporting carriages may be connected by pins, clearances or other positive connections to a circulating transporting means, for example a transporting chain known from the aforementioned prior art. Then there is also no need for a complicated drive for the retaining devices.

The elongated transporting carriages may be provided to the left and right of the path running through, with reference to the running-through direction. Alternatively, they may also transversely span the path running through, which however is considered to be less advantageous. The transporting carriages arranged on the left and right make it possible for them to be located for the most part, in particular completely, laterally alongside immersion tanks or the like for the substrates. In this way they are affected as little as possible.

The retaining frame is advantageously connected to the transporting carriages by means of a number of articulated levers or scissor joints. These make reliable and precise guidance possible, both in the vertical direction and in the directions along the transporting plane, for example in order to obtain an aforementioned angular stability or angular adjustability. Two scissor joints are advantageously provided on each longitudinal side of the retaining frame, for example one near a front region and another near a rear region. By means of these four scissor joints, the retaining frame is then fastened to the transporting carriages.

A link may be advantageously formed in such a way that it has an articulated lever, which is fastened by one end to the retaining frame pivotably about a point. The other end engages in a longitudinal slit on the transporting carriage, which runs in the transporting direction, and is mounted both displaceably and pivotably therein. In every position, the articulated lever can have an angle of less than 90° to the plane of the retaining frame, so that it is always at a shallow angle.

Such an articulated lever may in turn have in its middle region an intermediate lever pivotably connected to it. Another end of the intermediate lever is mounted on or fastened to the transporting carriage pivotably about a point. In this case, the two articulated levers on one side of the retaining device are pointing towards each other or inclined towards each other, extending from the retaining devices, while the intermediate levers point away. These intermediate levers can ensure that the lowering of the retaining frame always takes place parallel with respect to the transporting carriages, if this is to be ensured. A previously described, intermittent inclined lowering of the retaining frame may also be performed by means of differently formed articulated levers or intermediate levers.

In order to fasten a substrate to the retaining frame, elongated clamping devices may be provided in a front region and a rear region of the retaining frame. For example, continuous rods, which can be turned, and have a plurality of clamping lugs may be provided. With these clamping lugs, the substrate can be firmly clamped at several points.

In a embodiment of the invention, if the substrates on the retaining devices are to be treated electrochemically and therefore have to be electrically contacted from the outside, it may be provided that at least one transporting carriage is connected to the retaining frame in an electrically conducting manner for the electrical contact with a substrate held in the retaining frame to be established. External electrical contact with the transporting carriage can then be easily established, either by means of sliding contacts or by means of rails or transporting chains on which the transporting carriages are guided. Electrical contact of the retaining frame with the substrates can be established by means of aforementioned clamping devices, which are then of an electrically contacting or electrically conducting form. This does not have to apply to the clamping devices in their entirety. They may, for example, have a number of contact heads, which are movable and of a flat form at the end. In the same way as the rest of the clamping devices, they may lie in a clamping manner against a substrate restrained in the retaining frame and both retain it and electrically contact it.

An electrical connection between the transporting carriages and the retaining frame can take place by means of a linking device located in between, for example an aforementioned joint or scissor joint.

Alternatively, a flexible electrical line laid in a loop may be provided here.

The retaining frame is advantageously formed in a surrounding manner around the outside and its central region is substantially free. A front frame part and a rear frame part may be formed by parts running transversely to the transporting direction, which also have the aforementioned clamping devices. These two parts may be connected to each other by lateral connecting parts, so that the retaining frame is as intrinsically stable as possible, that is to say is self-supporting and remains dimensionally stable, and not just by virtue of being secured to the transporting carriages. This is particularly necessary for reliable transporting and safe securement of the substrates.

These and other features emerge not only from the claims but also from the description and the drawings, where the individual features can be realized in each case by themselves or as a plurality in the form of subcombinations in an embodiment of the invention and in other fields and can constitute advantageous and inherently protectable embodiments for which protection is claimed here. The subdivision of the application into individual sections and subheadings does not restrict the general validity of the statements made thereunder.

BRIEF DESCRIPTION OF THE DRAWINGS

Exemplary embodiments of the invention are illustrated schematically in the drawings and are explained in greater detail below. In the drawings.

DETAILED DESCRIPTION OF THE EXEMPLARY EMBODIMENTS

Figure 1:
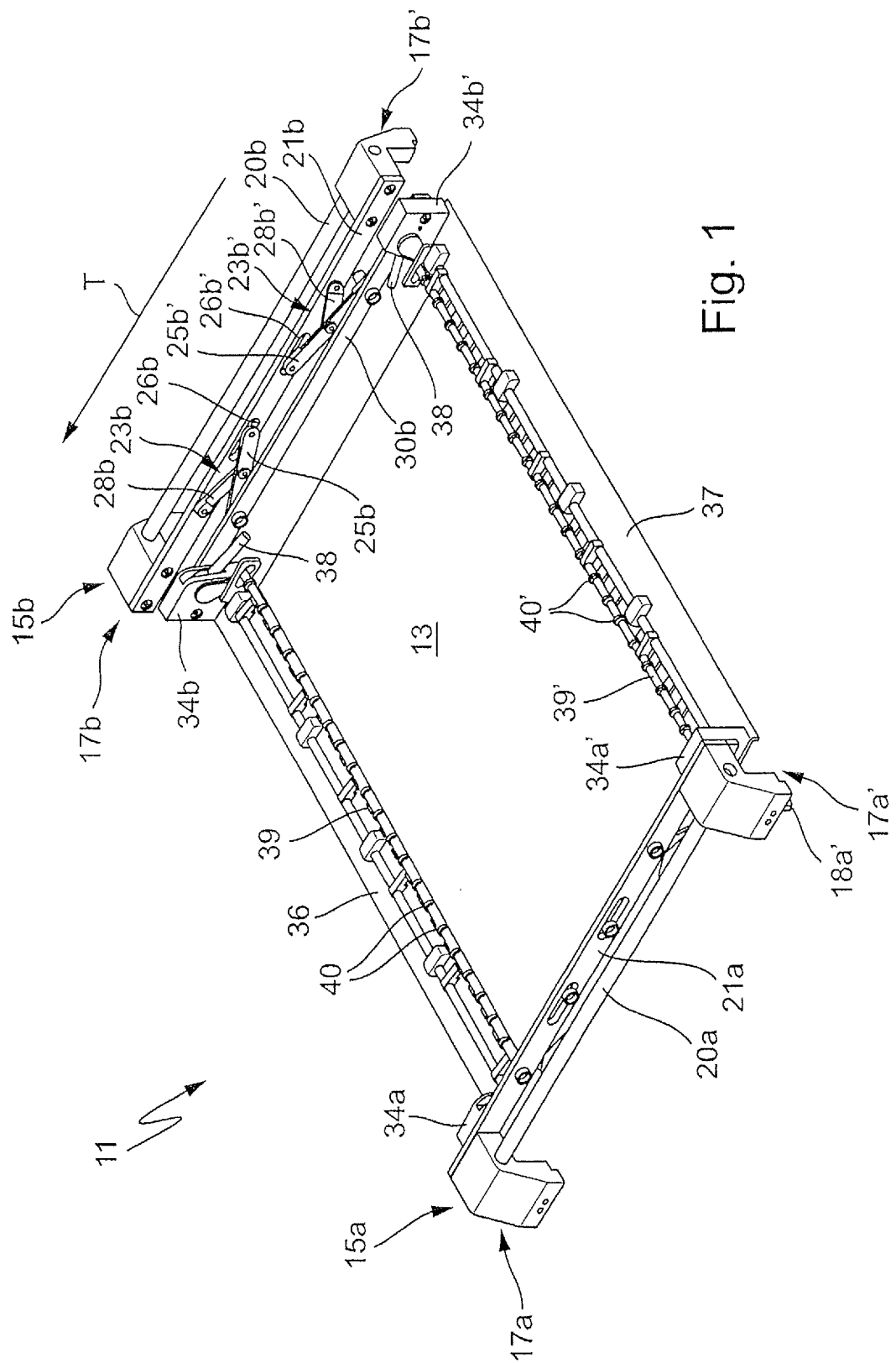
FIG. 1 shows an oblique plan view of a retaining device according to the invention with a restrained printed circuit board in the raised state of a retaining frame and FIG. 2 shows the retaining device from FIG. 1 with a lowered retaining frame.

FIG. 1 illustrates in an oblique plan view a retaining device 11 according to the invention in which a printed circuit board 13 is held or restrained. The retaining device 11 has a left-hand transporting carriage 15a and a right-hand transporting carriage 15b, which may be formed identically or as mirror images of each other. A transporting carriage 15 respectively comprises a front transporting part 17a and a rear transporting part 17a' or 17b and 17b'. The transporting parts 17 may, as illustrated, have downwardly pointing transporting projections 18a', with which they are hung on circulating transporting chains or the like in a way similar to the document cited at the beginning DE 10 2007 038 116 A1. Alternatively, the transporting parts 17 may have rollers for transporting on a rail or the like, the retaining devices 11 then being driven in a way not shown.

The two transporting parts 17a and 17a' or 17b and 17b' are respectively connected to each other by means of connecting rods 20a and 20b as well as retaining bars 21a and 21b. This ensures that they are constructed in a rigidly connected manner.

As described on the basis of the right-hand side, at the transporting carriage 15b, a front scissor joint 23b and a rear scissor joint 23b' are provided on the retaining bar 21b. The scissor joints 23 and 23' are fastened to or articulated on a side bar 30b, which is part of a lower retaining frame 32. In this arrangement, the side bars 30a and 30b are fastened to front retaining frame heads 34a and 34a' on the left-hand side and 34b and 34b' on the right-hand side. The retaining frame heads 34a and 34b of the left-hand and right-hand sides are connected to each other by means of a front clamping carrier 36 and a rear clamping carrier 37. The printed circuit board 13 is held in a way known per se on a continuous clamping rod 39 at the front and 39' at the rear, which are mounted in an articulated manner and have clamping lugs 40 and 40' at the rear. With respect to these clamping rods 39, and generally with respect to the clamping of the printed circuit board 13, reference is made to the aforementioned DE 10 2007 038 116 A1; see for example the configurations according to FIG. 12 or 13 therein. Clamping of the printed circuit board 13 may take place by means of clamping levers 38 in the retaining frame heads 34, either manually or mechanically.

The scissor joints 23 and 23' are constructed in such a way that, from the side bars 30a and 30b, an articulated lever 25a or 25a' and 25b or 25b' that is mounted pivotably about a single point protrudes upwards, to be precise in each case at an acute angle. An upper end of the articulated levers 25 engages in longitudinal slits 26a and 26a' or 26b and 26b' in the retaining bars 21a and 21b. They are mounted there both pivotably and longitudinally movably. Extending upwards approximately from the middle of the articulated levers 25 are pivotably mounted intermediate levers 28a and 28a' or 28b and 28b', to be precise at an acute angle to the horizontal and counter to the direction of the respective articulated lever 25. At the upper end, the intermediate levers 28 are in turn connected pivotably about a point to the retaining bars 21. This produces a height adjustability of the retaining frame 23 with respect to the transporting carriages 15a and 15b. In this arrangement, as can easily be seen, the function of the scissor joints 23 and 23' is such that they bring about raising or lowering of the retaining frame 32 in relation to the transporting carriages 15 substantially in the vertical direction without any great lateral offset. It can also be seen that uneven or oblique lowering of the retaining frame 32 is also possible, for example more with the front region downwards or more with the rear region. This is particularly of advantage for the aforementioned entry into or exit from a liquid bath.

Figure 2:
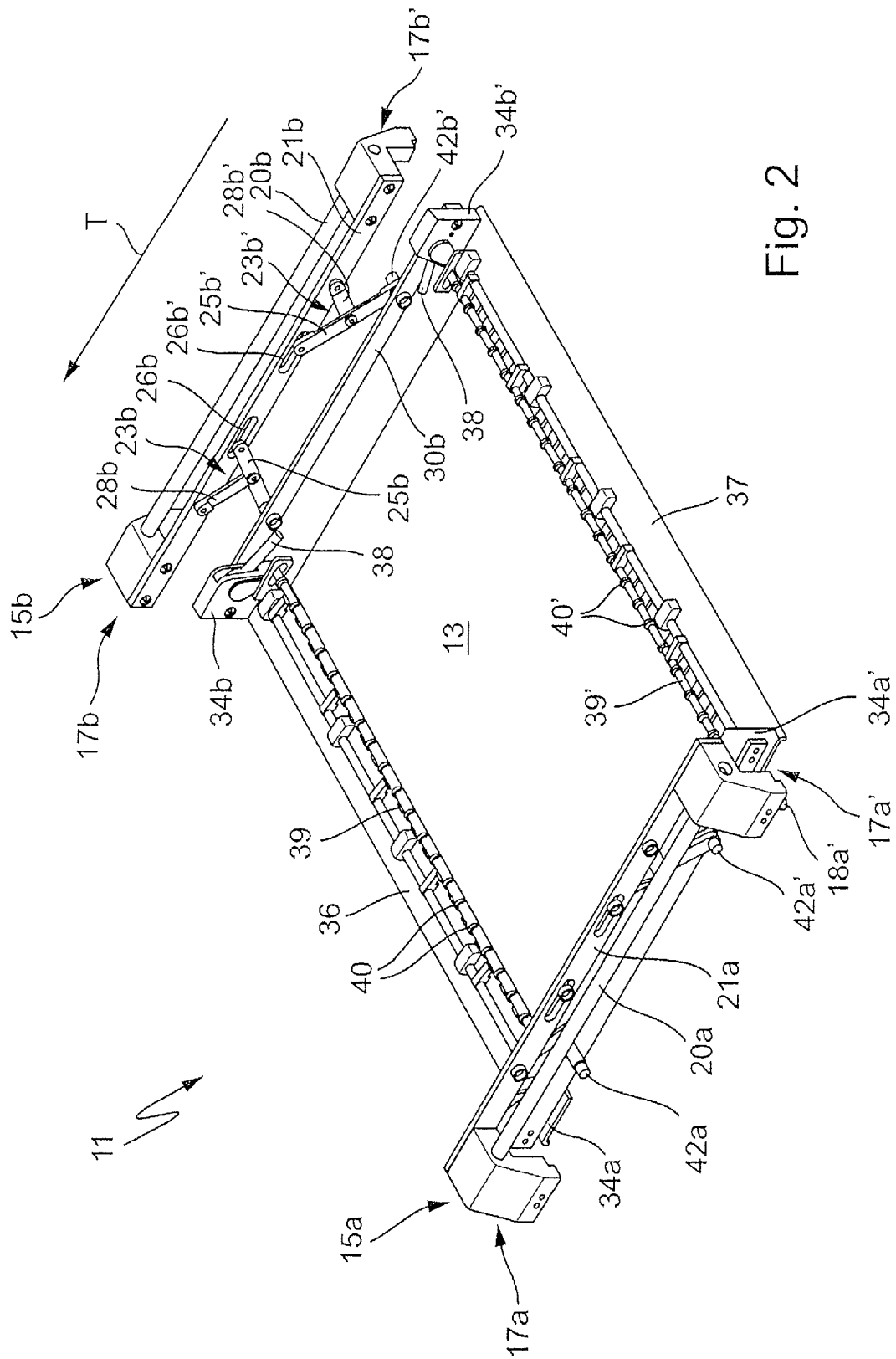

As is clear from FIG. 2, in its lowered state, provided on the side bars 30 for the height adjustment of the retaining frame 32 with respect to the transporting carriages 15 are guiding pins 42, for example protruding from the bearing points of the articulated levers 25 on the side bars 30. These clearly protruding guiding pins 42a and 42a' according to FIG. 2 can enter or be guided by slotted links along the transporting path of the retaining device 11. Thus, such slotted links or the like, not shown here but quite familiar to a person skilled in the art, can be used during the transport of the retaining device 11 for setting the height of the retaining frame 32 in relation to the transporting path along which the transporting carriages 15a and 15b travel, that is to say raising or lowering the restrained printed circuit board 13. The profile of such a slotted link is used to make this advantageously happen in such a way that both the lowering and the raising cannot take place too abruptly, but slowly and continuously. One result is that greater mechanical loads caused by impact, vibration or the like, both on the retaining device 11 and on the possibly sensitive printed circuit board 13, can be avoided. Furthermore, specifically when the printed circuit board 13 is raised or made to exit a liquid bath with a treatment medium, easy, good flowing away of treatment medium located on it, without excessive weight—together with corresponding weight-loading of the printed circuit board 13—can be achieved by inclining the printed circuit board.

Not shown, but easy to imagine from the figures, is a means for supplying power or establishing electrical contact for the printed circuit board 13. For this purpose, an electrical contact, a loop or the like may be advantageously provided on the outside of a transporting carriage 15, in a way similar to the transporting projection 18a'. When such a transporting projection 18a' is hung into a transporting chain, electrical contacting may either take place by this means or else a laterally protruding slider may lie against a power conducting rail, as generally known from means for establishing electrical contact.

From such an electrical contact, for example by way of the retaining bars 21 and the scissor joints 23 and 23', electrical contact to the retaining frame 32 and, in the latter, electrical contact to the printed circuit board 13, may be established by way of the clamping rods 39 together with clamping lugs 40. In this arrangement, it is possible in principle to provide electrical contacting, for example by means of sliders, just on one transporting part 17. However, it is more reliable and better for it to be provided on at least two transporting parts 17 of one side or on all the transporting parts. Instead of electrically conductive scissor joints 23 and 23', a flexible wire that can follow all the relative movements of the transporting carriages 15 and the retaining frame 32 may serve as the electrically conducting connection.

Further electrical contacting to the outside may be performed by way of the guiding pins 42a and 42a' when they run along electrically conducting slotted guiding links. However, this has the disadvantage in comparison with electrical contacting by way of the transporting parts 17 that, since the guiding pins 42 are approximately level with the printed circuit board 13, or just above it, it may happen that they run close to or in the liquid bath with the treatment medium, which is undoubtedly adverse for the electrical contacting.

Instead of the very simply formed scissor joints shown here, they could be of a different kind, which under some circumstances could also be formed as multiple scissor joints. In this way there could be much greater lowering of the retaining frame 32 in relation to the transporting carriages 15. In most cases, however, this will not be necessary.

The retaining frame 32 is therefore formed in a surrounding manner by the two side bars 30a and 30b, which are connected by means of the front clamping carrier 36 and the rear clamping carrier 37 and thus produce a surrounding, approximately rectangular frame.

Clamping rods 39 and clamping lugs 40 could also be provided on the underside of the clamping carriers 36 and 37, but for handling reasons it is better this way. Particularly, the state of the clamping fastening can also be inspected better.

The invention claimed is:
1. A retaining device for thin planar substrates, comprising:
  transporting carriages arranged on two outer longitudinal sides of the retaining device, said transporting carriages being intended for transporting said retaining device through continuously operating installations in a transporting direction; and
  a retaining frame for retaining said substrates, said retaining frame arranged between said transporting carriages, wherein said retaining frame is height-adjustably mounted on said transporting carriages by scissor joints, and
  wherein there are at least two said scissor joints provided on each of said longitudinal sides of said retaining frame, one said scissor joint being provided near a front region and one said scissor joint is provided near a rear region of said retaining frame.

2. The retaining device according to claim 1, wherein said height-adjustable mounting of said retaining frame on said transporting carriages is designed for relative movement of said retaining frame exclusively in a direction vertical to said transporting direction of said transporting carriages.

3. The retaining device according to claim 1, wherein, when there is a relative movement of said transporting carriages and said retaining frame in relation to one another due to a height adjustment, said retaining frame remains positionally stable in relation to said transporting carriages such that an unwanted change in inclination of or vibration of said retaining frame is avoided.

4. The retaining device according to claim 3, wherein said retaining frame remains aligned parallel to said transporting direction of said transporting carriages.

5. The retaining device according to claim 1, wherein, when there is a relative movement of said transporting carriages and said retaining frame in relation to one another with height adjustment, said retaining frame is adjustable in position in relation to said transporting carriages with a maximum angle to said transporting direction of 20° to 30°.

6. The retaining device according to claim 1, wherein one said scissor joint has an articulated lever pivotably fastened to said retaining frame about a point, and which is displaceably and pivotably mounted in a longitudinal slit on said transporting carriage.

7. The retaining device according to claim 6, wherein said articulated lever has an angle less than 90° to a plane of said retaining frame in any position.

8. The retaining device according to claim 6, wherein each said articulated lever is connected to an intermediate lever being pivotably articulated in said middle region of said articulated lever and mounted on said transporting carriage pivotably about a point.

9. The retaining device according to claim 8, wherein said articulated levers on one side of said retaining frame extend from said retaining frame such that they point towards a central region of said transporting carriage and said intermediate levers extend from said articulated levers such that they point away from said central region of said transporting carriage.

10. The retaining device according to claim 1, wherein at least one said scissor joint is of an electrically conducting form and is connected in an electrically conducting manner both to said transporting carriage and to said retaining frame or electrical conductors respectively running on said transporting carriages and said retaining frame.

11. The retaining device according to claim 1, wherein said retaining frame is formed in a surrounding manner around a free central region.

12. A retaining device for thin planar substrates, comprising:
   transporting carriages arranged on two outer longitudinal sides of the retaining device, said transporting carriages being intended for transporting said retaining device through continuously operating installations in a transporting direction;
   a retaining frame for retaining said substrates, said retaining frame arranged between said transporting carriages; and
   scissor joints connected between the transporting carriages and the retaining frame, such that said retaining frame is height-adjustably mounted on said transporting carriages,
   wherein at least one said transporting carriage is connected to said retaining frame in an electrically conducting manner for electrical contact to a substrate held in said retaining frame.

13. A retaining device for thin planar substrates, comprising:
   transporting carriages arranged on two outer longitudinal sides of the retaining device, said transporting carriages being intended for transporting said retaining device through continuously operating installations in a transporting direction;
   a retaining frame for retaining said substrates, said retaining frame arranged between said transporting carriages; and
   scissor joints connected between the transporting carriages and the retaining frame, such that said retaining frame is height-adjustably mounted on said transporting carriages,
   wherein clamping devices for said planar substrates are formed on said retaining frame in an electrically conducting manner.

* * * * *